(12) United States Patent
Weber

(10) Patent No.: US 6,593,763 B2
(45) Date of Patent: Jul. 15, 2003

(54) MODULE TEST SOCKET FOR TEST ADAPTERS

(75) Inventor: Axel Weber, Hemhofen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/941,957

(22) Filed: Aug. 28, 2001

(65) Prior Publication Data

US 2002/0079913 A1 Jun. 27, 2002

(30) Foreign Application Priority Data

Aug. 28, 2000 (DE) .......................... 100 42 224

(51) Int. Cl.⁷ .................. G01R 31/02; G01R 31/26; H01R 12/00; H01R 13/40; H01R 24/00
(52) U.S. Cl. .................. 324/755; 324/756; 324/765; 439/65; 439/631; 439/593
(58) Field of Search .................. 324/750–765; 439/65, 631, 592, 593

(56) References Cited

U.S. PATENT DOCUMENTS

| | | | |
|---|---|---|---|
| 2,951,185 A | | 8/1960 | Buck |
| 6,150,825 A | * | 11/2000 | Prokopp et al. ............. 324/537 |
| 6,414,510 B1 | * | 7/2002 | Takeuchi ..................... 324/765 |
| 6,437,586 B1 | * | 8/2002 | Robinson .................... 324/754 |

FOREIGN PATENT DOCUMENTS

| | | |
|---|---|---|
| DE | 196 18 717 C1 | 1/1998 |
| JP | 11-191465 | 7/1999 |

* cited by examiner

Primary Examiner—Vinh P. Nguyen
Assistant Examiner—Emily Y. Chan
(74) Attorney, Agent, or Firm—Laurence A. Greenberg; Werner H. Stemer; Ralph E. Locher

(57) ABSTRACT

A module test socket is described in which a memory module and a terminal board are disposed vertically in relation to each other in one plane. A first row of socket contacts and a second row of socket contacts are provided for electrically connecting the memory module to the terminal board in order to test the memory module.

10 Claims, 2 Drawing Sheets

MODULE TEST SOCKET FOR TEST ADAPTERS

BACKGROUND OF THE INVENTION

Field of the Invention

The present invention relates to a module test socket for test adapters and receives a module containing an integrated circuit having a multiplicity of first contact points. The module test socket has a terminal board with a first connection device for connecting to a tester. The terminal board has second contact points, and a second connection device, which is able to establish electrical connections between the second contact points and first contact points.

For testing modules containing integrated circuits, such as for example memory modules, test adapters are used, currently containing a maximum of eight module test sockets lying in parallel with one another in accordance with a tester that can be connected to the test adapter. In other words, in such a test adapter a tester is assigned eight module test sockets, which are each able to receive one module, that is for example a memory module, so that altogether eight memory modules can be subjected to a test simultaneously. On account of the further development of the testers, it would be possible at the present time for this parallelism of eight modules to be increased to sixteen modules.

In practice, however, so far it has not been possible to achieve parallelism of sixteen module test sockets for receiving a total of sixteen modules, since the individual module test sockets currently cannot be made narrower than approximately with a width of 25 mm. Owing to the configuration of automatic insertion machines, however, for doubling the parallelism from eight modules to sixteen modules a spacing between neighboring test sockets each with a terminal board of at most 15 mm is required. In other words, to allow modules actually to be inserted into sixteen module test sockets with the current automatic insertion machines, the test sockets including terminal board must not be wider than 15 mm. This is because it is only then that modules can be inserted by an automatic insertion machine into two adjacent module test sockets.

Creating a module test socket, which satisfies this condition has so far not been contemplated, since the existing terminal boards, which are also referred to as mounting boards, have horizontally alone a width of approximately 25 mm.

Consequently, for parallel measurement of 8 modules, that is for "8-up measurement" as it is known, the terminal board used is a printed-circuit board which has horizontally the width mentioned of 25 mm and has mounted on it by the surface mounting technique a module test socket into which a module is inserted.

For the configuration of a module test socket, it is of significance that in some cases over 200 coaxial cables and numerous capacitors have to be soldered onto the terminal board or printed-circuit board. This condition also makes it difficult to maintain a maximum spacing of 15 mm.

Finally, it must also be taken into account that not only the numerous components mentioned above have to be accommodated on the terminal board. Rather, it is also important to ensure a connection between the tester and the module to be tested that is as short as possible and technically well-adapted for radio frequency.

SUMMARY OF THE INVENTION

It is accordingly an object of the invention to provide a module test socket for test adapters that overcomes the above-mentioned disadvantages of the prior art devices of this general type, which is distinguished by a small width and in which a connection between a tester and the module to be tested that is short and technically well-adapted for radio frequency can be created.

With the foregoing and other objects in view there is provided, in accordance with the invention, a module test socket for a test adapter and receives a module having an integrated circuit with a multiplicity of first contact points. The module test socket contains a terminal board having a first connection device for connecting to a tester, second contact points, and a second connection device for establishing electrical connections between the second contact points and the first contact points. The terminal board and the module lie with their principal surfaces in one plane. The second connection device has first and second rows of socket contacts, at least one of the socket contacts of the first row is in each case electrically connected to at least one of the socket contacts of the second row and the socket contacts of the first row are electrically connected to the first contact points. The socket contacts of the second row are electrically connected to the second contact points. The second connection device has conductive rubber blocks and one of the socket contacts of the first row and one of the socket contacts of the second row in each case are pressed by a respective one of the conductive rubber blocks against one of the first contact points and one of the second contact points, respectively.

The object is achieved in the case of a module test socket of the type stated at the beginning according to the invention by the terminal board and the module lying with their principal surfaces in one plane, which preferably runs vertically. The terminal board has the second connection device containing two rows of socket contacts, and at least one socket contact of the first row in each case is electrically connected to at least one socket contact of the second row and by the socket contacts of the first row being connected to the first contact points and the socket contacts of the second row being connected to the second contact points.

The module test socket according to the invention is distinguished by a series of considerable advantages, attributable to the fact that the module and the terminal board lie in one plane, which is preferably vertically directed. For this purpose, the contactor block forming the module test socket is configured in a special way, which will be explained in the description of the figures on the basis of the exemplary embodiment.

In the case of the module test socket according to the invention, there is no longer any need for a previously necessary horizontal printed-circuit board, so that no soldering points between a horizontal printed-circuit board and a vertical printed-circuit board are required. The electrical path between the module and the coaxial cable to the tester is short, thereby ensuring a connection between the tester and the module to be tested that is technically well-adapted for radio frequency. If need be, there is adequate space on the terminal board for additional components, such as capacitors, resistors, inductances etc. The coaxial cable, which leads to the tester may simply be attached to the terminal board and is easily accessible, which considerably improves the ease of maintenance and repair of the module test socket. The electrical connection between the terminal board and the memory module via the socket contacts is extremely short. A minimum spacing between neighboring module test sockets of less than 15 mm can be readily maintained on account of the vertical alignment of the module and terminal board. This makes a doubling of the modules to be tested in parallel, to currently a total of sixteen modules, readily possible in the case of the existing automatic insertion machines. Soldered junctions between the module and the terminal board are not required thanks to the simultaneous contacting of the module and the terminal board via the socket contacts.

In the module test socket, the terminal board can be readily exchanged, depending on the type of module to be tested in each case. As a result, the module test socket can be used for various modules, such as in particular memory modules, by the appropriate terminal boards being inserted into it in each case. In other words, the terminal board is configured according to the type of module to be tested. If need be, it can receive interference-suppression capacitors and other additional components and be connected to coaxial cables which lead to the tester.

In accordance with an added feature of the invention, the first connection device is a coaxial cable.

In accordance with an additional feature of the invention, a plastic holding block is provided and the socket contacts are mounted in the plastic holding block. The plastic holding block is formed of a plastic with low a thermal expansion such as Torlon.

In accordance with a further feature of the invention, the first row and the second row in each case contains two series of the socket contacts, which, lying opposite each other, contact a principal surface of the module and of the terminal board, respectively.

In accordance with another feature of the invention, the module is a memory module.

In accordance with a concomitant feature of the invention, the socket contacts are gold-plated and the socket contacts are disposed next to one another at a spacing of approximately 1 mm, in particular a spacing of 1.27 mm.

Other features which are considered as characteristic for the invention are set forth in the appended claims.

Although the invention is illustrated and described herein as embodied in a module test socket for test adapters, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
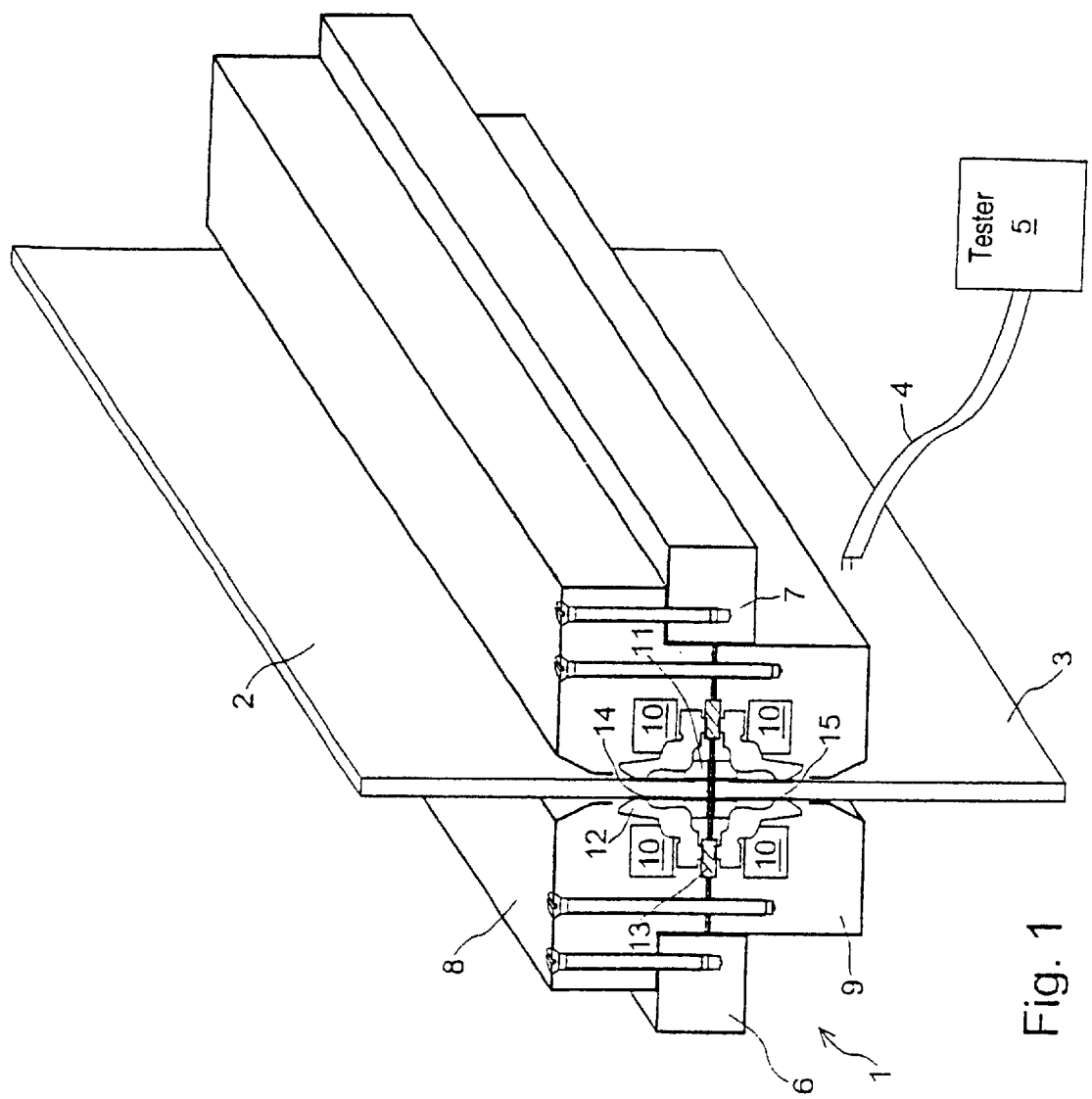
FIG. 1 is a diagrammatic, perspective view of a module test socket according to the invention.

In all the figures of the drawing, sub-features and integral parts that correspond to one another bear the same reference symbol in each case. Referring now to the figures of the drawing in detail and first, particularly, to FIG. 1 thereof, there is shown a module test socket 1, into which a memory module 2 is inserted from above and a terminal board 3 is inserted from below in such a way that the memory module 2 and the terminal board 3 lie in a vertically running plane. The terminal board 3 is adapted in its electrical structure to the type of memory module to be tested in each case and contains appropriate components, such as for example transistors, diodes, capacitors, inductances, interference-suppression capacitors etc. The components are not shown in FIGS. 1 and 2.

The terminal board 3 is connected via a coaxial cable 4 to a tester 5, in which there is stored in particular a special test program, to which the memory module 2 is subjected. Instead of one coaxial cable 4, if need be more than one coaxial cable 4 may also be provided between the tester 5 and the terminal board 3.

The tester 5 may be connected to a multiplicity of module test sockets 1. For the currently customary automatic insertion machines, which insert the memory modules 2 into the individual module test sockets 1, a configuration in which eight module test sockets of the type shown in FIGS. 1 and 2 lie one behind the other and form a row, and in which two such rows are disposed next to each other, is preferred. In other words, next to the module test socket of FIG. 1 or 2 there is a second such module test socket 1, and these adjacent module test sockets 1, 1 have in each case seven further module test sockets disposed after them perpendicularly in relation to the plane of the drawing. The condition mentioned at the beginning for the spacing between the terminal boards 3 can be maintained, since the overall width of the module test socket 1 is approximately 15 mm (given a height of 25 mm). A configuration of 16 module tests sockets 1 in a row is also possible.

It goes without saying that, with different automatic insertion machines, the module test sockets 1 may also be disposed in a different way. The alignment of the plane formed by the terminal board 3 and the memory module 2 is also not necessarily vertical. Rather, other configurations, in which this plane runs horizontally, are also conceivable. All that is important is that the memory module 2 and the terminal board 3 both lie with their principal surfaces in a common plane.

Instead of the memory module 2, other modules, which contain an integrated circuit may also be tested. The module 2 consequently need not necessarily be a memory module.

To be specific, the module test socket 1 contains two holding rails 6, 7, which run parallel to each other and to which an upper part 8 is bolted. Bolted to the upper part 8 is a lower part 9.

It is consequently possible, for example, first to loosen the lower part 9 from the upper part 8, in order then to separate the upper part 8 from the holding rails 6, 7.

Instead of a bolted connection between the upper part 8 and the holding rails 6, 7 and between the upper part 8 and the lower part 9, some other suitable connection may also be chosen, such as for example a clamping connection or the like.

Figure 2:
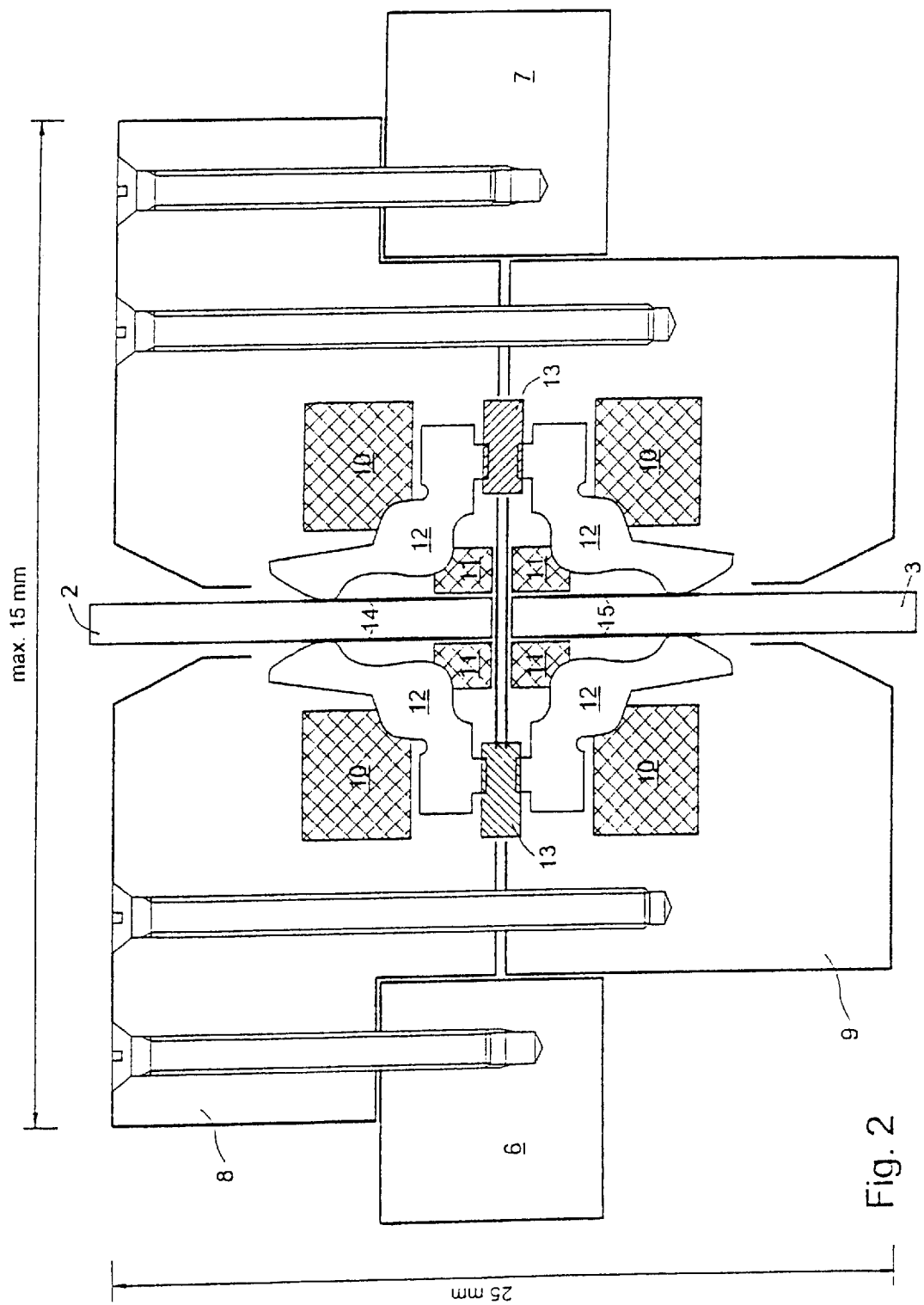
FIG. 2 is an enlarged sectional view of the module test socket shown in FIG. 1.

In the upper part 8 and in the lower part 9 there are holding blocks 10, 11 made of Torlon or some other insulating plastic, which has an extremely low coefficient of thermal expansion (also see FIG. 2). Mounted in the holding blocks 10, 11 are socket contacts 12 with a gold-plated surface, which lie with a spacing of approximately 1 mm, such as for example 1.27 mm, next to one another, that is perpendicularly in relation to the plane of the drawing, and are pressed by conductive rubber blocks 13 against contact points 14 on the memory module 2 or contact points 15 on the terminal board 3. In the exemplary embodiment of FIGS. 1 and 2, altogether two rows of socket contacts 12 are provided. Each row contains two series of socket contacts 12, which, lying opposite each other, contact the two principal surfaces of the module 2 and of the terminal board 3, respectively. As a result, conductive connections are established between the contact points 15 on the terminal board 3 via the socket contacts 12 and the conductive rubber block 13 to the contact points 14 on the memory module 2.

The conductive rubber block 13 is configured in such a way that an electrical short-circuit between neighboring socket contacts is avoided. For this purpose, the conductive rubber block 13 may be divided into individual portions by insulating layers, so that each portion is assigned only to one socket contact 12 of the upper row and one socket contact 12 of the lower row.

In the exemplary embodiment represented, the terminal board 3 and the memory module 2 are provided with contact points 15, 14 on both sides. This does not necessarily have to be the case. Rather, it is adequate if contact points are present on a principal surface of the memory module 2 and of the terminal board 3 and the contact points 14, 15 lie on the same side, so that an electrical connection can be established between the terminal points 14 and 15 by the socket contacts 12 and the conductive rubber block 13.

I claim:

1. A module test socket for a test adapter and for receiving a module having an integrated circuit with a multiplicity of first contact points, the module test socket comprising:

a terminal board having a first connection device for connecting to a tester, second contact points, and a second connection device for establishing electrical connections between said second contact points and the first contact points, said terminal board and the module lying with their principal surfaces in one plane, said second connection device having first and second rows of socket contacts, at least one of said socket contacts of said first row being in each case electrically connected to at least one of said socket contacts of said second row and said socket contacts of said first row being electrically connected to the first contact points, said socket contacts of said second row being electrically connected to said second contact points, said second connection device having conductive rubber blocks and one of said socket contacts of said first row and one of said socket contacts of said second row in each case being pressed by a respective one of said conductive rubber blocks against one of the first contact points and one of said second contact points, respectively.

2. The module test socket according to claim 1, wherein said first connection device is a coaxial cable.

3. The module test socket according to claim 1, including a plastic holding block and said socket contacts are mounted in said plastic holding block.

4. The module test socket according to claim 3, wherein said plastic holding block is formed of a plastic with low a thermal expansion.

5. The module test socket according to claim 4, wherein said plastic is Torlon.

6. The module test socket according to claim 1, wherein said first row and said second row in each case contains two series of said socket contacts, which, lying opposite each other, contact a principal surface of the module and of said terminal board, respectively.

7. The module test socket according to claim 1, wherein the module is a memory module.

8. The module test socket according to claim 1, wherein said socket contacts are gold-plated.

9. The module test socket according to claim 1, wherein said socket contacts are disposed next to one another at a spacing of approximately 1 mm.

10. The module test socket according to claim 1, wherein said socket contacts are disposed next to one another at a spacing of approximately 1.27 mm.

* * * * *